US009472344B2

(12) United States Patent
Fujimura et al.

(10) Patent No.: US 9,472,344 B2
(45) Date of Patent: Oct. 18, 2016

(54) ELECTRONIC COMPONENT

(71) Applicant: TDK CORPORATION, Tokyo (JP)

(72) Inventors: Tomoyoshi Fujimura, Tokyo (JP); Atsushi Sato, Tokyo (JP); Masahiro Mori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/918,903

(22) Filed: Oct. 21, 2015

(65) Prior Publication Data

US 2016/0118192 A1    Apr. 28, 2016

(30) Foreign Application Priority Data

Oct. 24, 2014  (JP) .................. 2014-217209

(51) Int. Cl.
| | |
|---|---|
| H01G 4/06 | (2006.01) |
| H05K 7/00 | (2006.01) |
| H01G 4/30 | (2006.01) |
| H01G 4/12 | (2006.01) |
| H01G 4/012 | (2006.01) |
| H05K 1/18 | (2006.01) |
| H01G 4/248 | (2006.01) |
| H05K 1/11 | (2006.01) |

(52) U.S. Cl.
CPC .............. *H01G 4/30* (2013.01); *H01G 4/012* (2013.01); *H01G 4/12* (2013.01); *H01G 4/248* (2013.01); *H05K 1/11* (2013.01); *H05K 1/181* (2013.01)

(58) Field of Classification Search
CPC .......... H01G 4/30; H01G 4/12; H01G 4/248; H01G 4/012; H05K 1/11; H05K 1/181
See application file for complete search history.

(56) References Cited

U.S. PATENT DOCUMENTS

| | | | |
|---|---|---|---|
| 2009/0059469 A1* | 3/2009 | Lee ................. | H01G 4/012 361/306.2 |
| 2010/0095498 A1* | 4/2010 | Aoki ................ | H01G 4/012 29/25.42 |
| 2014/0041915 A1* | 2/2014 | Hattori ............. | H05K 1/18 174/260 |
| 2015/0014040 A1* | 1/2015 | Ahn ................. | H01G 4/30 174/260 |
| 2015/0115893 A1* | 4/2015 | Lee ................. | H01G 4/30 320/135 |

FOREIGN PATENT DOCUMENTS

JP    H07-111380 A    4/1995

* cited by examiner

*Primary Examiner* — Hoa C Nguyen
(74) *Attorney, Agent, or Firm* — Oliff PLC

(57) ABSTRACT

An electronic component includes a multilayer capacitor and an interposer. The multilayer capacitor includes an element body and a pair of external electrodes. The interposer includes a substrate having first and second principal faces, a pair of first electrodes disposed on the first principal face, and a pair of second electrodes disposed on the second principal face so as to be separated from the pair of first electrodes in a first direction or in a second direction. Widths of the pair of external electrodes and the pair of first electrodes are smaller than a width of the element body. The element body has a first portion covered by the external electrode, and a pair of second portions located on both sides of the first portion. The pair of second portions are separated from the interposer and overlap the pair of second electrodes when viewed from a third direction.

6 Claims, 15 Drawing Sheets

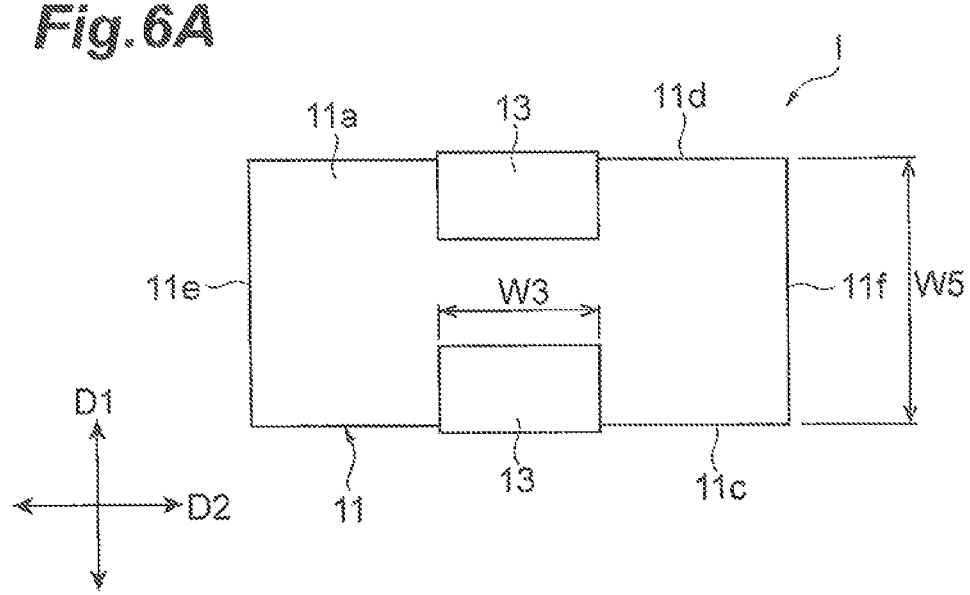
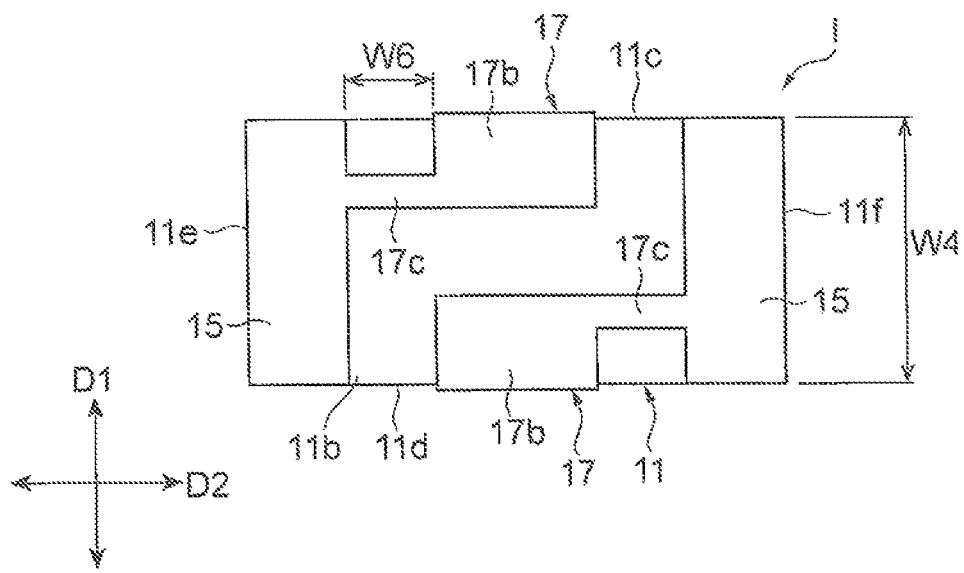

Fig.11
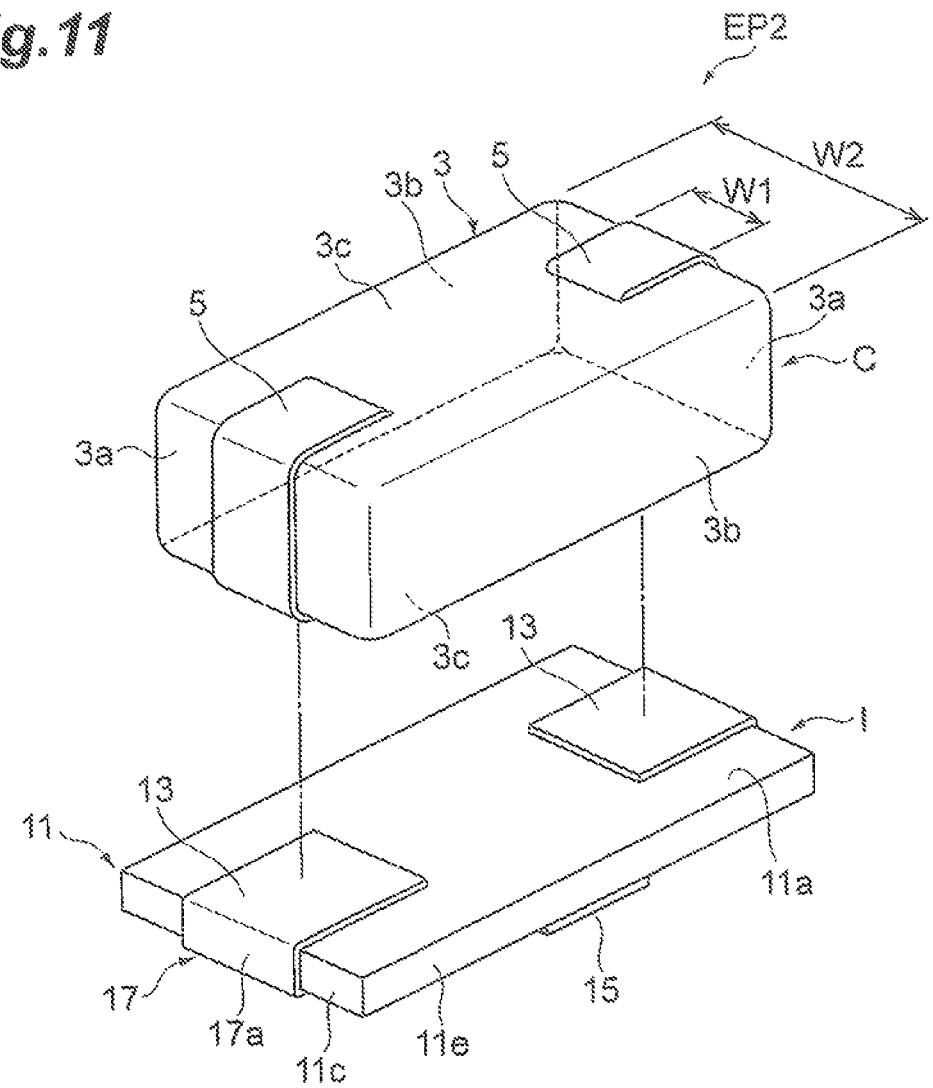
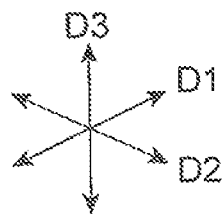

ELECTRONIC COMPONENT

TECHNICAL FIELD

An aspect of the present invention relates to an electronic component having a multilayer capacitor and an interposer on which the multilayer capacitor is mounted.

BACKGROUND

A known electronic component is one including a multilayer capacitor and an interposer on which the multilayer capacitor is mounted (e.g., cf. Japanese Patent Application Laid-open Publication No. H07-111380).

When a voltage is applied to the multilayer capacitor, an element body thereof is subject to mechanical strain in the magnitude according to the applied voltage due to the electrostrictive effect. This mechanical strain induces vibration in the multilayer capacitor (which will be referred to hereinafter as "electrostrictive vibration"). In a state in which the multilayer capacitor is mounted on an electronic device (e.g., a circuit board or another electronic component or the like), the electrostrictive vibration propagates to the electronic device with application of the voltage to the multilayer capacitor. The propagation of the electrostrictive vibration to the electronic device may lead to vibration of the electronic device, so as to cause so-called acoustic noise.

In the aforementioned electronic component, as described above, the multilayer capacitor is mounted on the interposer. When the electronic component is mounted on the electronic device, the multilayer capacitor is connected via the interposer to the electronic device. For this reason, the electrostrictive vibration is less likely to propagate to the electronic device, and thus occurrence of the acoustic noise is suppressed.

SUMMARY

In the foregoing electronic component, the multilayer capacitor is mounted so that the element body of the multilayer capacitor is in contact with the interposer. When the element body of the multilayer capacitor is in contact with the interposer, the electrostrictive vibration induced in the multilayer capacitor propagates directly from the element body to the interposer. The electrostrictive vibration having propagated to the interposer may propagate from the interposer to the electronic device to cause vibration of the electronic device. Namely, in the case of the foregoing electronic component, it is difficult to fully suppress the occurrence of acoustic noise.

An object of one aspect of the present invention is to provide an electronic component capable of fully suppressing the occurrence of acoustic noise.

An electronic component according to one aspect of the present invention is an electronic component including a multilayer capacitor and an interposer on which the multilayer capacitor is mounted. The multilayer capacitor includes a multilayer body of a substantially rectangular parallelepiped shape in which a plurality of dielectric layers and a plurality of internal electrodes are stacked; and a pair of external electrodes disposed on ends in a first direction in the multilayer body and each connected to a corresponding internal electrode of the plurality of internal electrodes. The interposer includes a substrate having a first principal face of a planar shape opposed to the multilayer capacitor, a second principal face of a planar shape opposed to the first principal face, first and second side faces of a planar shape opposed to each other in the first direction, and third and fourth side faces of a planar shape opposed to each other in a second direction perpendicular to a direction in which the first and second principal faces are opposed, and perpendicular to the first direction; a pair of first electrodes disposed on the first and second side face sides of the first principal face and each connected to a corresponding external electrode of the pair of external electrodes; and a pair of second electrodes disposed on the third and fourth side face sides of the second principal face so as to be separated from the pair of first electrodes in the first direction or in the second direction and each electrically connected to a corresponding first electrode of the pair of first electrodes. Widths in the second direction of the pair of external electrodes and the pair of first electrodes are smaller than a width in the second direction of the multilayer body. The multilayer body, when viewed from the first direction, has a first portion covered by the external electrode, and a pair of second portions located on both sides of the first portion and exposed from the external electrode. The pair of second portions of the multilayer body are separated from the interposer and overlap the pair of second electrodes when viewed from the direction in which the first and second principal face are opposed.

In the foregoing electronic component according to the one aspect, the pair of second portions of the multilayer body are separated from the interposer. For this reason, the electrostrictive vibration induced in the multilayer capacitor is prevented from propagating directly from each second portion of the multilayer body to the interposer.

The external electrodes of the multilayer capacitor are connected to the first electrodes of the interposer. The widths in the second direction of the pair of external electrodes and the pair of first electrodes are smaller than the width in the second direction of the element body. For this reason, the electrostrictive vibration generated in the first portion being a part of the multilayer body propagates mainly through the external electrodes and the first electrodes to the substrate of the interposer. Therefore, the vibration propagating from the multilayer body to the substrate of the interposer is little as a result.

The pair of second electrodes are disposed so as to be separated from the pair of first electrodes in the first direction or in the second direction. For this reason, the vibration having propagated to the first electrodes propagates through portions located between the first electrodes and the second electrodes in the substrate, to reach the second electrodes. The vibration propagating in the substrate attenuates while propagating through the portions located between the first electrodes and the second electrodes in the substrate.

For these reasons, the electronic component according to the one aspect successfully reduces the vibration propagating from the multilayer capacitor through the interposer to the electronic device. As a result, the occurrence of acoustic noise is fully suppressed.

In the foregoing electronic component according to the one aspect, the pair of second portions of the multilayer body overlap the pair of second electrodes when viewed from the direction in which the first and second principal faces are opposed. For this reason, the size of the substrate of the interposer can be set approximately equal to or slightly larger than the multilayer capacitor, for example, when viewed from the direction in which the first and second principal faces are opposed. This enables high-density mounting of electronic components.

The electronic component may further include a pair of connection electrodes each of which connects the first electrode and the second electrode, the connection electrode connected to the first electrode disposed on the first side face side may be disposed on the first side face and on the second principal face, and the connection electrode connected to the first electrode disposed on the second side face side may be disposed on the second side face and on the second principal face. In this case, each connection electrode is not located on the first principal face opposed to the multilayer capacitor. For this reason, even if each second portion of the multilayer body vibrates due to the electrostrictive vibration, each second portion will be kept out of contact with the connection electrode. Therefore, the vibration of each second portion of the multilayer body is surely prevented from propagating to the interposer.

The plurality of internal electrodes may overlap the pair of second electrodes when viewed from the direction in which the first and second principal faces are opposed. In this case, the size of each internal electrode can be set relatively large. The capacitance of the multilayer capacitor increases with increasing size of the internal electrodes if there is no variation in spacing between the internal electrodes adjacent in the stack direction. Therefore, it is feasible to achieve increase in capacitance of the multilayer capacitor.

Each of the pair of first electrodes may have first and second electrode portions separated from each other in the second direction. In this case, each external electrode of the multilayer capacitor is connected to each of the first electrode portion and the second electrode portion. Since the first electrode portion and the second electrode portion are separated from each other in the second direction, the multilayer capacitor (multilayer body) is maintained in a stable posture on the interposer. This makes the multilayer capacitor unlikely to be mounted in an inclined state. Therefore, the second portions of the multilayer body are prevented from coming into contact with the interposer. As a result, the occurrence of acoustic noise is surely suppressed.

Each of the pair of second electrodes may have third and fourth electrode portions separated from each other in the first direction. In this case, the electronic component is mounted on an electronic device through the third electrode portion and the fourth electrode portion in each second electrode, whereby the electronic component is kept in a stable posture. This prevents the electronic component from being mounted in an inclined state.

The pair of second electrodes may be disposed so as to be separated from the peripheral edge of the second principal face when viewed from the direction in which the first and second principal faces are opposed. In this case, when the electronic component is soldered to the electronic device, solder is prevented from flowing up to the first principal face side of the substrate. This prevents the multilayer body of the multilayer capacitor and the substrate of the interposer from being directly connected through the solder.

BRIEF DESCRIPTION OF THE DRAWINGS

FIG. 6A is a top plan view showing an interposer in FIG. 1 and FIG. 6B a bottom plan view showing the interposer in FIG. 1.

FIG. 11 is an exploded perspective view showing the electronic component according to the second embodiment.

DETAILED DESCRIPTION

The embodiments according to one aspect of the present invention will be described below in detail with reference to the accompanying drawings. It is noted that in the description the same elements or elements with the same functionality will be denoted by the same reference signs, without redundant description.

First Embodiment

Figure 1:
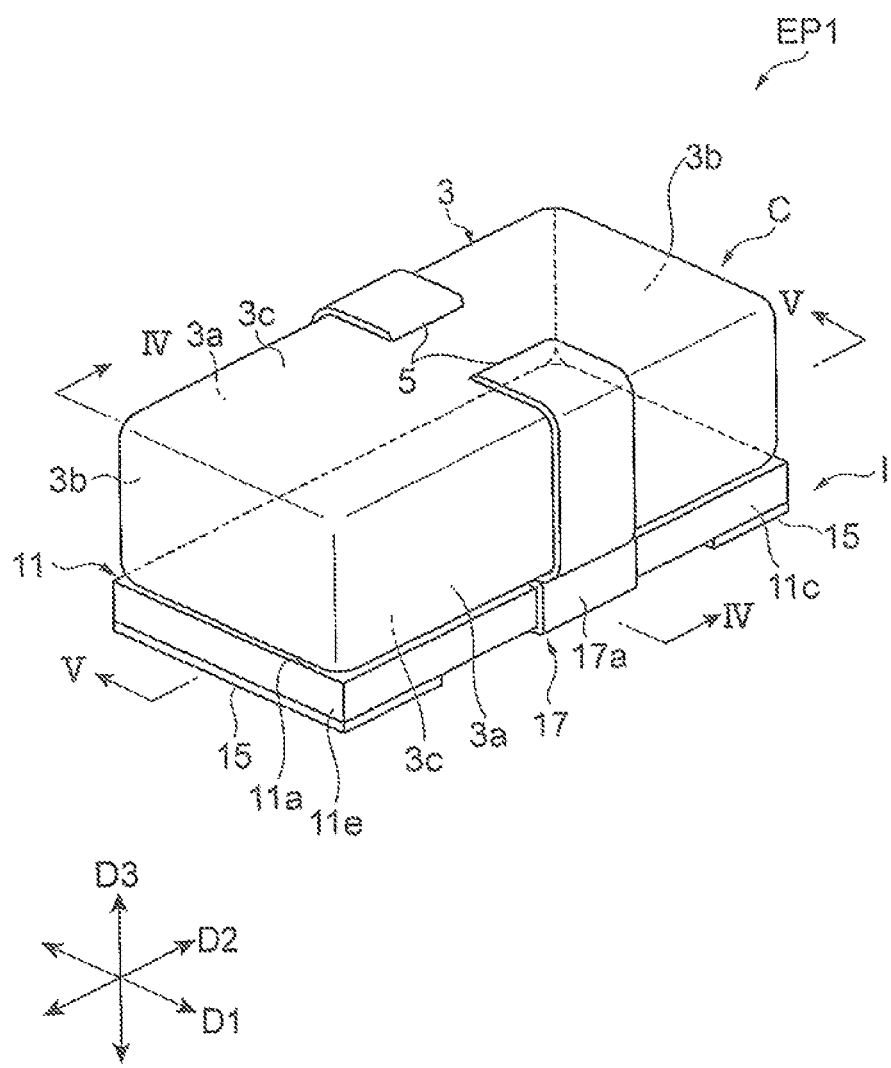
FIG. 1 is a perspective view showing an electronic component according to a first embodiment.
Figure 2:
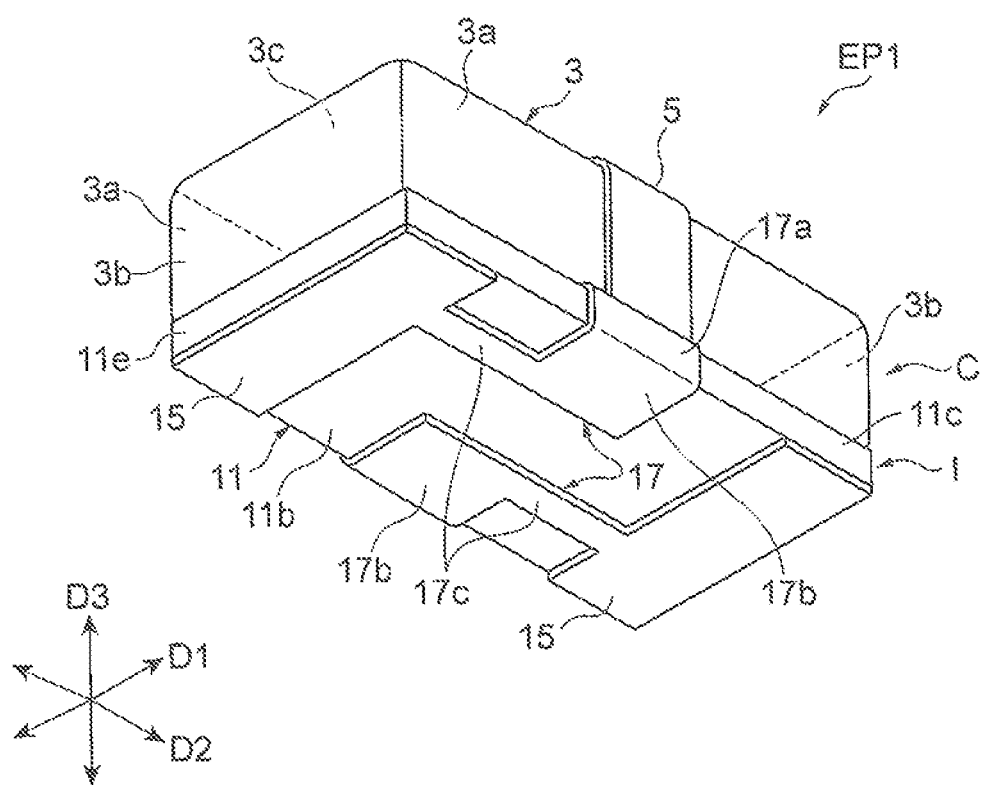
FIG. 2 is a perspective view showing the electronic component according to the first embodiment.
Figure 3:
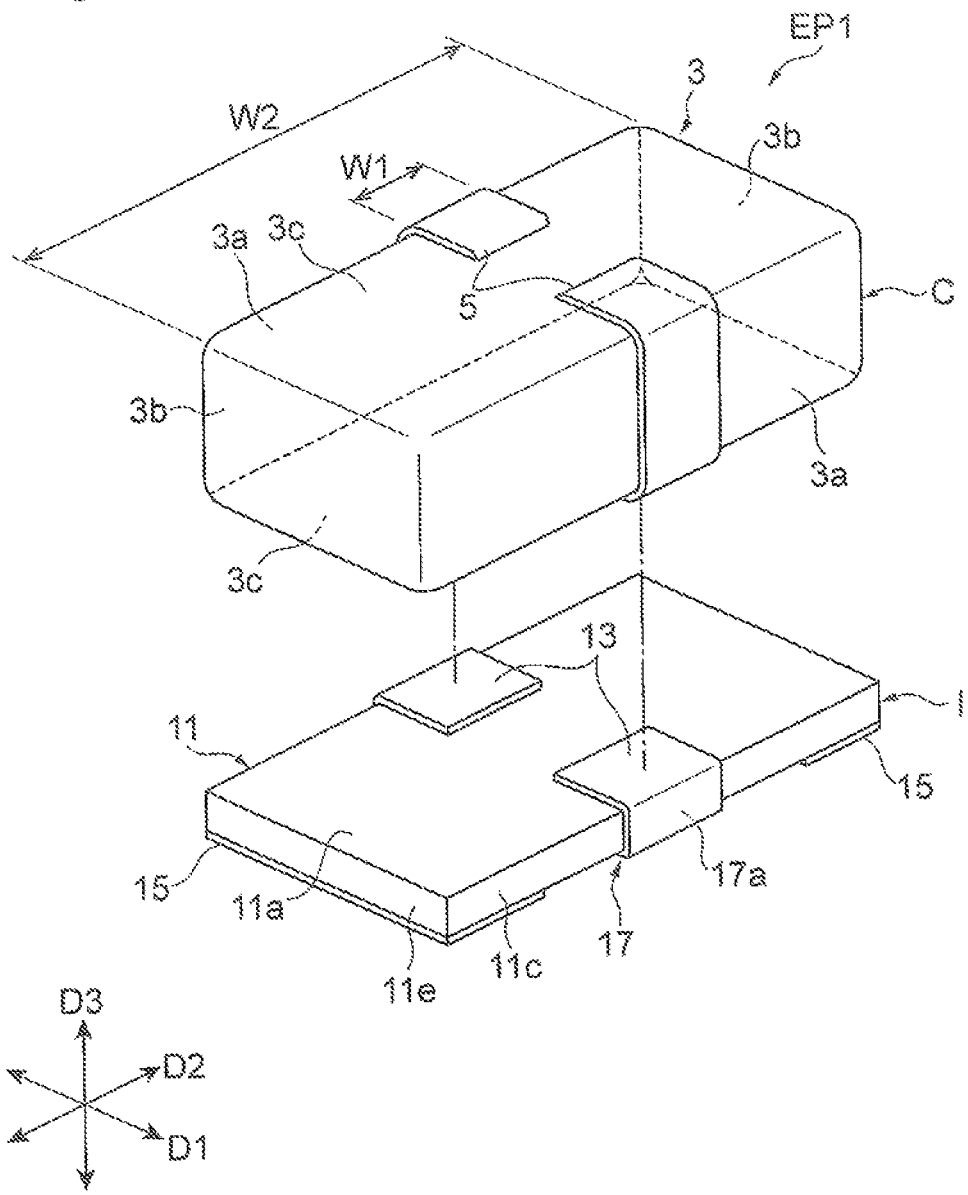
FIG. 3 is an exploded perspective view showing the electronic component according to the first embodiment.
Figure 4:
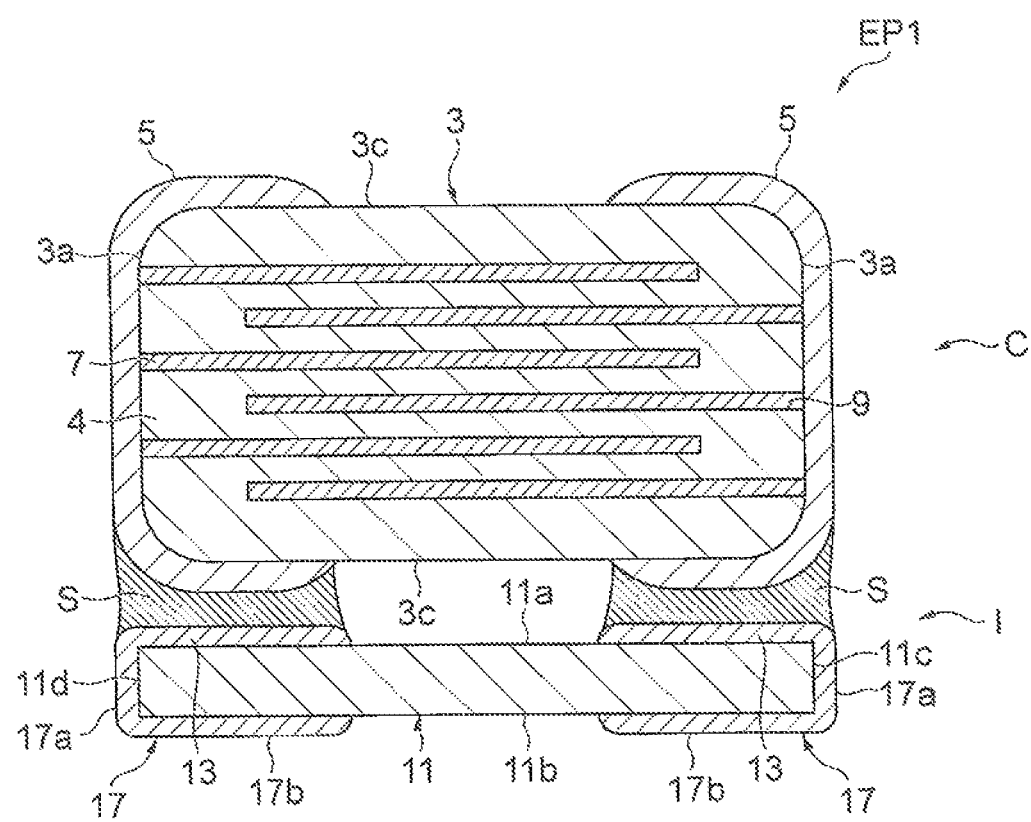
FIG. 4 is a drawing for explaining a cross-sectional configuration along the line IV-IV in FIG. 1.
Figure 5:
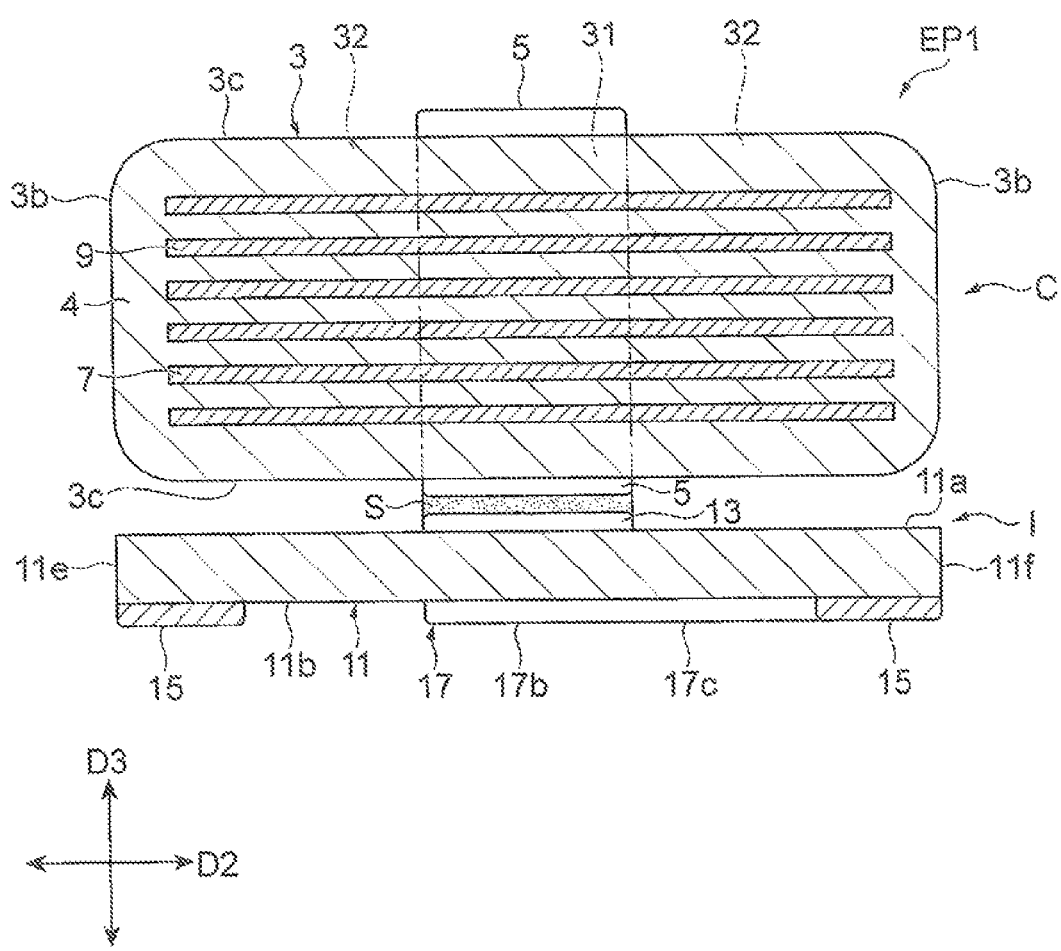
FIG. 5 is a drawing for explaining a cross-sectional configuration along the line V-V in FIG. 1.

The configuration of the electronic component EP1 according to a first embodiment will be described with reference to FIGS. 1 to 5 and FIGS. 6A and 6B. FIGS. 1 and 2 are perspective views showing the electronic component of the first embodiment. FIG. 3 is an exploded perspective view showing the electronic component of the first embodiment. FIG. 4 is a drawing for explaining the cross-sectional configuration along the line IV-IV in FIG. 1. FIG. 5 is a drawing for explaining the cross-sectional configuration along the line V-V in FIG. 1. FIG. 6A is a top plan view showing the interposer in FIG. 1 and FIG. 6B a bottom plan view showing the interposer in FIG. 1.

As shown in FIGS. 1 to 5, the electronic component EP1 includes a multilayer capacitor C and an interposer I on which the multilayer capacitor C is mounted. In the present embodiment, the multilayer capacitor C and the interposer I are connected by solder S. Namely, the multilayer capacitor C is mounted on the interposer I with solder. The multilayer capacitor C and the interposer I may be connected to each other with an electroconductive resin.

The multilayer capacitor C includes an element body (multilayer body) 3 and a pair of external electrodes 5 disposed on the exterior surface of the element body 3.

The element body 3 is of a substantially rectangular parallelepiped shape. The element body 3 has, as its exterior surface, a pair of first side faces 3a, a pair of second side faces 3b, and a pair of third side faces 3c. The first side faces 3a are opposed to each other in a first direction D1. The pair of second side faces 3b are opposed to each other in a second direction D2 perpendicular to the first direction D1. The pair of third side faces 3c are opposed to each other in a third direction D3 perpendicular to the first direction D1 and the second direction D2. Each of each first side face 3a, each second side face 3b, and each third side face 3c is of a substantially rectangular shape. The longitudinal direction of the element body 3 is the direction in which the pair of second side faces 3b are opposed, i.e., the second direction D2.

The pair of first side faces 3a extend in the third direction D3 so as to connect the pair of third side faces 3c. The pair of first side faces 3a also extend in the second direction D2 so as to connect the pair of second side faces 3b. The pair of second side faces 3b extend in the third direction D3 so as to connect the pair of third side faces 3c. The pair of second side faces 3b also extend in the first direction D1 so as to connect the pair of first side faces 3a. The pair of third side faces 3c extend in the first direction D1 so as to connect the pair of first side faces 3a. The pair of third side faces 3c also extend in the second direction D2 so as to connect the pair of second side faces 3b.

A pair of external electrodes 5 are disposed on ends in the first direction D1 in the element body 3. The pair of external electrodes 5 are disposed so as to cover central regions in the longitudinal direction (the second direction D2) in the pair of first side faces 3a. The both ends in the third direction D3 of the pair of external electrodes 5 are disposed so as to extend up onto the pair of third side faces 3c. Each of the pair of external electrodes 5 has an electrode portion disposed on a central region in the second direction D2 in one of the pair of first side faces 3a, and electrode portions each of which is disposed on a central region in the longitudinal direction (second direction D2) and edge region on the first side face 3a side in one of the pair of third side faces 3c. The width W1 in the second direction D2 of the pair of external electrodes 5 is smaller than the width W2 in the second direction D2 of the element body 3. Each external electrode 5 is formed, for example, by delivering an electroconductive paste containing electroconductive metal powder and glass frit onto the exterior surface of the element body 3 and sintering it. In certain cases, a plated layer is formed, if necessary, on each external electrode 5 thus sintered. The external electrodes 5 are electrically isolated from each other on the exterior surface of the element body 3.

As shown in FIGS. 4 and 5, the element body 3 is configured of a plurality of dielectric layers 4 stacked in the third direction D3. In the element body 3, a direction in which the plurality of dielectric layers 4 are stacked (hereinafter simply referred to as "stack direction") is coincident with the third direction D3. Each dielectric layer 4 is comprised, for example, of a sintered body of a ceramic green sheet containing a dielectric material (e.g., a $BaTiO_3$-based, $Ba(Ti, Zr)O_3$-based, or $(Ba, Ca)TiO_3$-based dielectric ceramic). In the element body 3 in practice, the dielectric layers 4 are integrally formed so that boundaries between the dielectric layers 4 cannot be visually recognized.

The element body 3 includes a plurality of internal electrodes 7 and a plurality of internal electrodes 9. The element body 3 is configured as a multilayer body in which the plurality of dielectric layers 4 and the plurality of internal electrodes 7 and 9 are stacked. Each internal electrode 7 or 9 is of a substantially rectangular shape, for example, on a plan view from the third direction D3. Each internal electrode 7, 9 is comprised of an electroconductive material commonly used for the internal electrodes of multilayer electric devices (e.g., Ni or Cu or the like). Each internal electrode 7, 9 is configured as a sintered body of an electroconductive paste containing the foregoing electroconductive material.

The internal electrodes 7 and the internal electrodes 9 are located at different positions (or in different layers) in the third direction D3. Namely, the internal electrodes 7 and the internal electrodes 9 are alternately disposed so as to be opposed with a space in between in the third direction D3. Each internal electrode 7 is exposed at one end in one of the first side faces 3a. Each internal electrode 7 is electrically connected to one of the external electrodes 5 at the one end exposed in the one of the first side faces 3a. Each internal electrode 9 is exposed at the other end in the other of the first side faces 3a. Each internal electrode 9 is electrically connected to the other of the external electrodes 5 at the other end exposed in the other of the first side faces 3a. Namely, the pair of external electrodes 5 are connected to the corresponding internal electrodes out of the plurality of internal electrodes 7, 9. The polarity of each internal electrode 7 is different from that of each internal electrode 9.

As shown in FIG. 5, the element body 3 has a first portion 31, and a pair of second portions 32. The first portion 31 is covered by the external electrode 5 when viewed from the first direction D1 (cf. FIG. 1). The second portions 32 are located on both sides of the first portion 31 and exposed from the external electrode 5. The pair of second portions 32 are separated from the interposer I in the third direction D3. For this reason, the electrostrictive vibration induced in the multilayer capacitor C is prevented from propagating directly from each second portion 32 of the element body 3 to the interposer I.

As shown in FIGS. 1 to 5 and FIGS. 6A and 6B, the interposer I includes a substrate 11, a pair of first electrodes 13, a pair of second electrodes 15, and a pair of connection electrodes 17. In the present embodiment, each first electrode 13, each second electrode 15, and each connection electrode 17 are comprised, for example, of Cu or the like.

The substrate 11 is of a substantially rectangular shape on a plan view from the third direction D3. The substrate 11 has first and second principal faces 11a, 11b, first and second side faces 11c, 11d, and third and fourth side faces 11e, 11f. The first and second principal faces 11a, 11b are of a planar shape and are opposed to each other in the third direction D3. The third direction D3 is a direction in which the first principal face 11a and the second principal face 11b are opposed. The first and second side faces 11c, 11d are of a planar shape and are opposed to each other in the first direction D1. The third and fourth side faces 11e, 11f are of a planar shape and are opposed to each other in the second direction D2. The substrate 11 has an electrically insulating property. The substrate 11 is comprised, for example, of an electrically insulating resin such as glass epoxy resin. The thickness of the substrate 11 is set, for example, in the range of 60 to 300 μm.

The first and second side faces 11c, 11d extend in the third direction D3 so as to connect the first and second principal faces 11a, 11b. The first and second side faces 11c, 11d also extend in the second direction D2 so as to connect the third and fourth side faces 11e, 11f. The third and fourth side faces 11e, 11f extend in the third direction D3 so as to connect the first and second principal faces 11a, 11b. The third and fourth side faces 11e, 11f also extend in the first direction D1 so as to connect the first and second side faces 11c, 11d.

The first principal face 11a is opposed to the multilayer capacitor C in the third direction D3. The first and second principal faces 11a, 11b are of a rectangular shape with the long sides along the second direction D2 and the short sides along the first direction D1. The substrate 11 is formed in the size approximately equal to or slightly larger than the multilayer capacitor C, when viewed from the third direction D3.

The pair of first electrodes 13 are disposed on the first side face 11c side and on the second side face 11d side, respectively, of the first principal face 11a. Namely, the pair of first electrodes 13 are separated in the first direction D1 on the first principal face 11a. The pair of first electrodes 13 are disposed on a central region in the second direction D2 in the first principal face 11a. The width W3 in the second direction D2 of the pair of first electrodes 13 is smaller than the width W2 in the second direction D2 of the element body 3. In the present embodiment, the width W3 in the second direction D2 of the pair of first electrodes 13 is equal to the width W1 in the second direction D2 of the pair of external electrodes 5. Each of the pair of first electrodes 13 is of a rectangular shape.

One of the external electrodes 5 is connected to one of the first electrodes 13. The other electrode 5 is connected to the other first electrode 13. Namely, the pair of first electrodes 13 are connected to the respective corresponding external electrodes out of the pair of external electrodes 5. The multilayer capacitor C is disposed on the interposer I so that one of the third side faces 3c is opposed to the first principal face 11a of the interposer I in the third direction D3.

The pair of second electrodes 15 are electrically connected to the corresponding first electrodes 13 out of the pair of first electrodes 13. The pair of second electrodes 15 are disposed on the third side face 11e side and on the fourth side face 11f side, respectively, of the second principal face 11b. Namely, the pair of second electrodes 15 are separated in the second direction D2 on the second principal face 11b. The pair of second electrodes 15 overlap the pair of second portions 32 of the element body 3 when viewed from the third direction D3. In the present embodiment, each of the pair of second electrodes 15 is of a rectangular shape. The width W4 in the first direction D1 of the pair of second electrodes 15 is equal to the width W5 in the first direction D1 of the substrate 11.

The pair of second electrodes 15 each are disposed so as to be separated in the first direction D1 or in the second direction D2 from the pair of first electrodes 13. In the present embodiment, the pair of second electrodes 15 each are disposed so as to be separated in the second direction D2 from the pair of first electrodes 13.

The pair of first electrodes 13 and the pair of second electrodes 15 do not overlap each other when viewed from the third direction D3. Namely, there are portions of the substrate 11 where neither of the first electrodes 13 and the second electrodes 15 is disposed, on the first principal face 11a and on the second principal face 11b. In other words, the substrate 11 has the portions where the first electrodes 13 are disposed and the portions where the second electrodes 15 are disposed, which are separated through portions located between the first electrodes 13 and the second electrodes 15.

The pair of connection electrodes 17 connect the first electrodes 13 to the second electrodes 15. Namely, one of the connection electrodes 17 electrically connects one of the first electrodes 13 to one of the second electrodes 15. The other connection electrode 17 electrically connects the other first electrode 13 to the other second electrode 15.

The connection electrode 17 connected to the first electrode 13 disposed on the first side face 11c side of the first principal face 11a is disposed on the first side face 11c and on the second principal face 11b. The connection electrode 17 connected to the first electrode 13 disposed on the second side face 11d side of the first principal face 11a is disposed on the second side face 11d and on the second principal face 11b. The pair of connection electrodes 17 include a pair of first connection electrodes 17a, a pair of second connection electrodes 17b, and a pair of third connection electrodes 17c. The pair of first connection electrodes 17a are disposed on the first and second side faces 11c, 11d. The pair of second connection electrodes 17b and the pair of third connection electrodes 17c are disposed on the second principal face 11b.

The first connection electrodes 17a are disposed so as to cover a central region in the longitudinal direction (the second direction D2) of the first and second side faces 11c, 11d. Each first connection electrode 17a extends from the first principal face 11a to the second principal face 11b along the third direction D3. In the present embodiment, each first connection electrode 17a is of a substantially rectangular shape when viewed from the first direction D1. The width in the second direction D2 of each first connection electrode 17a is equal to the width W3 in the second direction D2 of each first electrode 13. The end on the first principal face 11a side of each first connection electrode 17a is connected to the corresponding first electrode 13. The end on the second principal face 11b side of each first connection electrode 17a is connected to the corresponding second connection electrode 17b.

The second connection electrodes 17b are disposed on the first side face 11c side and on the second side face 11d side, respectively, of the second principal face 11b. Namely, the second connection electrodes 17b are separated in the first direction D1 on the second principal face 11b. In the present embodiment, each second connection electrode 17b is of a substantially rectangular shape when viewed from the third direction D3. The second connection electrodes 17b entirely overlap the corresponding first electrodes 13 when viewed from the third direction D3. The width in the second direction D2 of the pair of second connection electrodes 17b is equal to the width W3 in the second direction D2 of each first electrode 13. Namely, in the present embodiment, each of the widths in the second direction D2 of each first connection electrode 17a and each second connection electrode 17b of each connection electrode 17 is equal to the width W3 in the second direction D2 of each first electrode 13.

Each third connection electrode 17c extends in the second direction D2 on the second principal face 11b and connects one of the second connection electrodes 17b to the second electrode 15 corresponding to the one of the second connection electrodes 17b. Each third connection electrode 17c is separated from the peripheral edge of the second principal face 11b when viewed from the third direction D3. Namely, each third connection electrode 17c is separated from each of the first to fourth side faces 11c to 11f. In the present embodiment, each third connection electrode 17c is of a substantially rectangular shape when viewed from the third direction D3. Since the width in the first direction D1 of each third connection electrode 17c is set small, transmission of vibration is reduced.

On the substrate 11, each third connection electrode 17c is located in a region where neither of the first electrode 13 and the second electrode 15 is disposed. Namely, the width W6 in the second direction D2 of each third connection electrode 17c corresponds to the width in the second direction D2 of the region where neither of the first electrode 13 and the second electrode 15 is disposed. In other words, the region where the first electrode 13 is disposed is separated in the second direction D2 from the region where the second electrode 15 is disposed.

In the electronic component EP1, as shown in FIGS. 4 and 5, the element body 3 of the multilayer capacitor C is separated from the first principal face 11a of the interposer I. In the present embodiment, the element body 3 and the first principal face 11a are separated from each other in the third direction D3 by a total thickness of the thickness of the external electrodes 5, the thickness of the first electrodes 13, and the thickness of solder S interposed between the external electrodes 5 and the first electrodes 13. For this reason, the electrostrictive vibration induced in the multilayer capacitor C is prevented from propagating directly from the second portions 32 of the element body 3 to the interposer I. This suppresses the acoustic noise.

The element body 3 of the multilayer capacitor C overlaps the pair of second electrodes 15, when viewed from the third direction D3. In the present embodiment, when viewed from the third direction D3, the substantially entire area of the second electrodes 15 overlaps the element body 3 of the multilayer capacitor C. Namely, the size of the multilayer capacitor C is the size corresponding to the pair of second electrodes 15. In other words, the size of the multilayer capacitor C is the same as the size of a capacitor connected to an electronic device ED without intervention of the interposer I. It is often the case that with decrease in the size of the multilayer capacitor C, the acoustic noise can be reduced, but it may result in failure in ensuring a sufficient capacitance. In the present embodiment, the size of the multilayer capacitor C is maintained and thus the capacitance of the multilayer capacitor C is readily ensured at a sufficient level.

The internal electrodes 7, 9 of the multilayer capacitor C overlap the pair of second electrodes 15 when viewed from the third direction D3. In the present embodiment, when viewed from the third direction D3, the substantially entire area of the second electrodes 15 overlaps the internal electrodes 7, 9. In this manner the internal electrodes 7, 9 have the size enough to overlap at least the pair of second electrodes 15. This allows the electronic component EP1 to ensure the sufficient capacitance of the multilayer capacitor C.

When the multilayer capacitor C is applied, for example, to an output capacitor of a DC-DC converter, it can reduce ripple voltage. The ripple voltage is reduced with increase in the capacitance of the multilayer capacitor C. As the ripple voltage becomes lower, the electrostrictive vibration induced in the multilayer capacitor C is more reduced. Therefore, the increase in the capacitance of the multilayer capacitor C leads to reduction in electrostrictive vibration per se. As a result, the occurrence of acoustic noise is suppressed.

Figure 7:
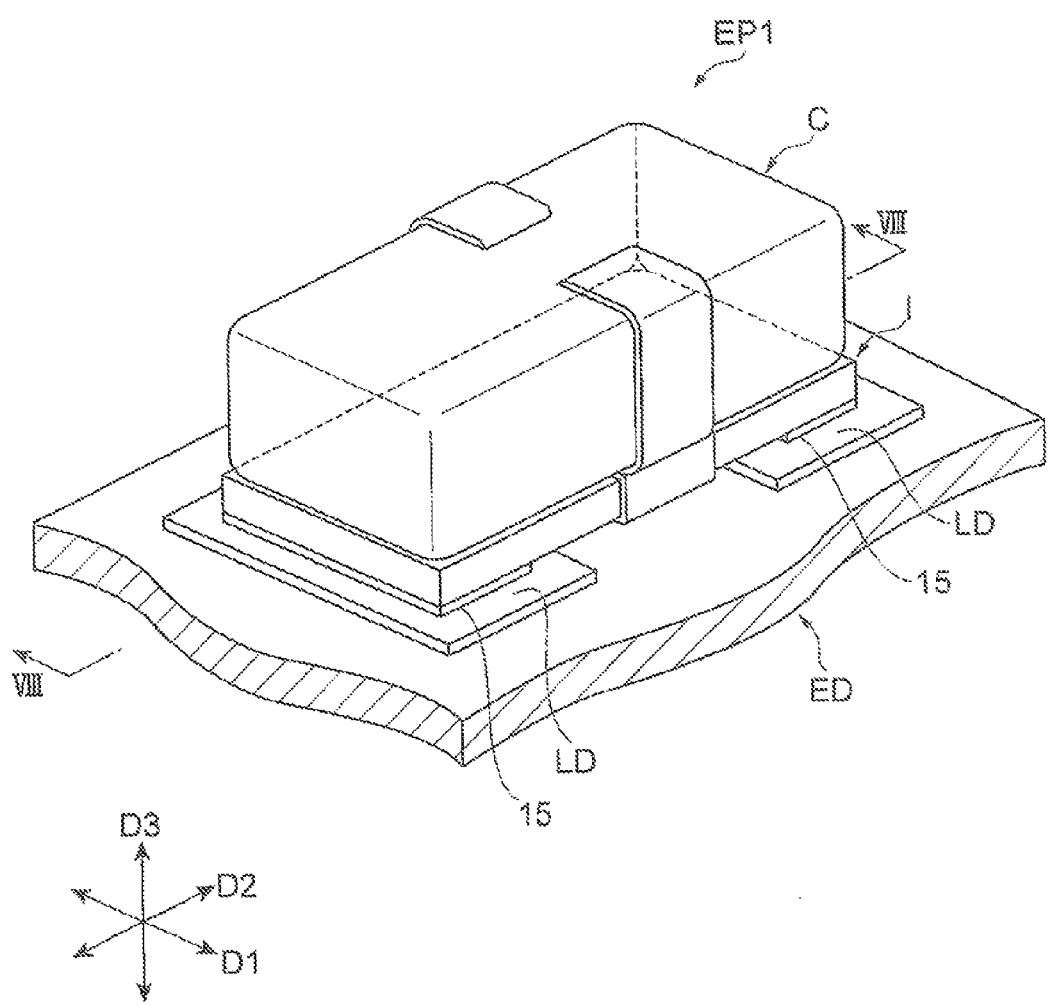
FIG. 7 is a perspective view showing a mounting example of the electronic component according to the first embodiment.
Figure 8:
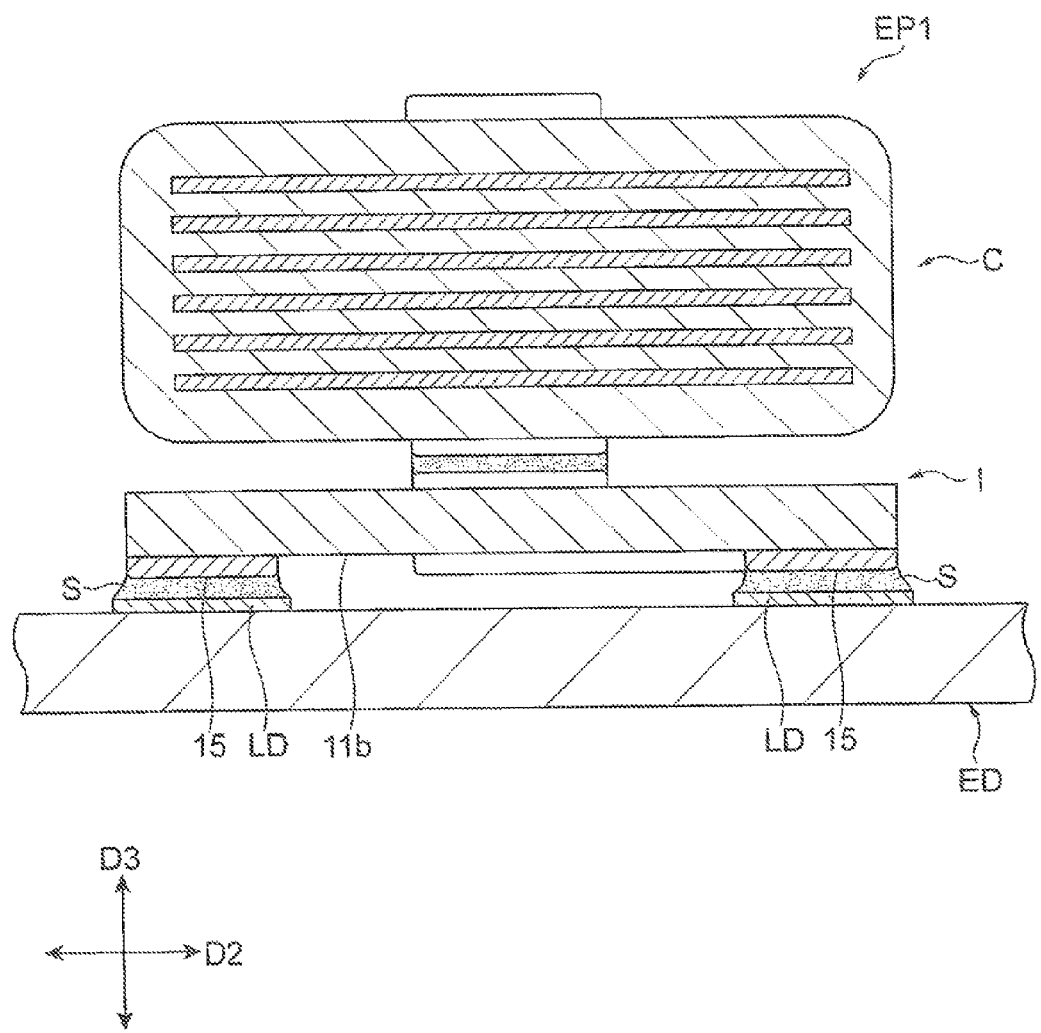
FIG. 8 is a drawing for explaining a cross-sectional configuration along the line VIII-VIII in FIG. 7.

The following will describe a mounting example of the electronic component EP1, with reference to FIGS. 7 and 8. FIG. 7 is a perspective view showing the mounting example of the electronic component according to the first embodiment. FIG. 8 is a drawing for explaining the cross-sectional configuration along the line VIII-VIII in FIG. 7.

As shown in FIGS. 7 and 8, the electronic component EP1 is mounted on an electronic device ED. In the electronic component EP1, the second principal face 11b is a mount surface to the electronic device ED. In this mounting example, the electronic component EP1 is mounted on the electronic device ED with solder. Specifically, each second electrode 15 is connected to one of land electrodes LD provided on the electronic device ED with solder S.

In a state in which the electronic component EP1 is mounted on the electronic device ED, the multilayer capacitor C is connected through the interposer I to the electronic device ED. For this reason, the electrostrictive vibration induced in the multilayer capacitor C is less likely to propagate to the electronic device ED, when compared to the case where the multilayer capacitor C is connected directly to the electronic device ED without intervention of the interposer I. The occurrence of acoustic noise is suppressed accordingly.

Each of the width W1 in the second direction D2 of the pair of external electrodes 5 and the width W3 in the second direction D2 of the pair of first electrodes 13 is preferably set, for example, to not more than 0.30 times the width W2 in the second direction D2 of the element body 3, with high effect of preventing the acoustic noise. Furthermore, the width in the first direction D1 of each third connection electrode 17c is preferably set, for example, to not less than 0.25 times the width W5 in the first direction D1 of the substrate 11, with easiness of improvement in ESR.

Second Embodiment

Figure 9:
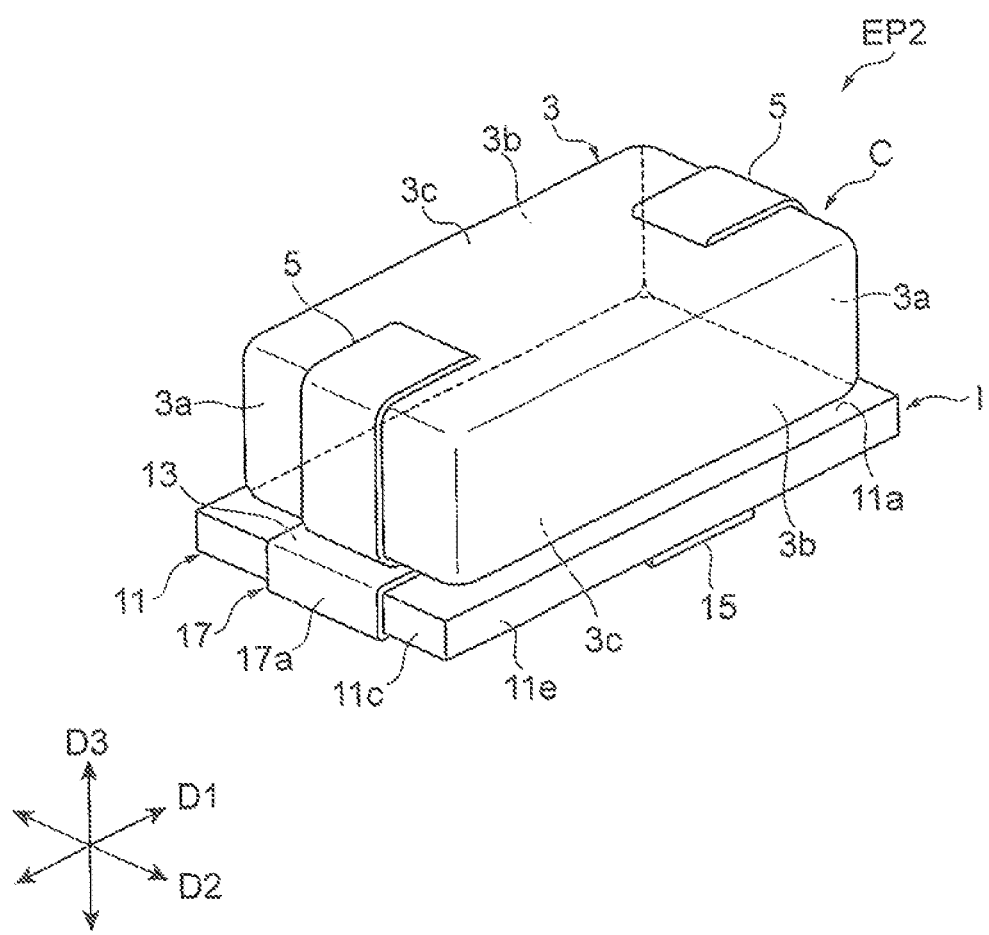
FIG. 9 is a perspective view showing an electronic component according to a second embodiment.
Figure 10:
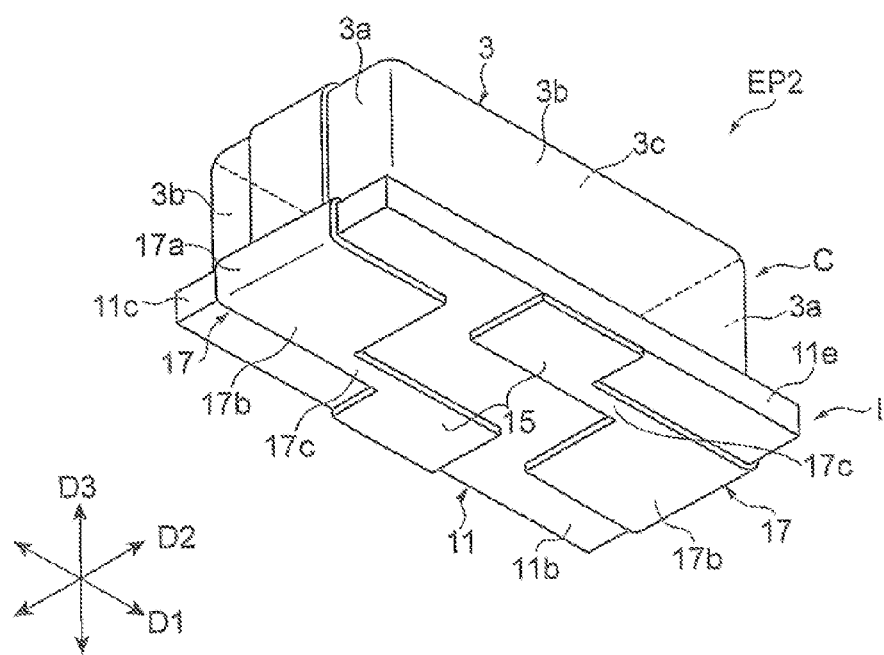
FIG. 10 is a perspective view showing the electronic component according to the second embodiment.
Figure 12A:
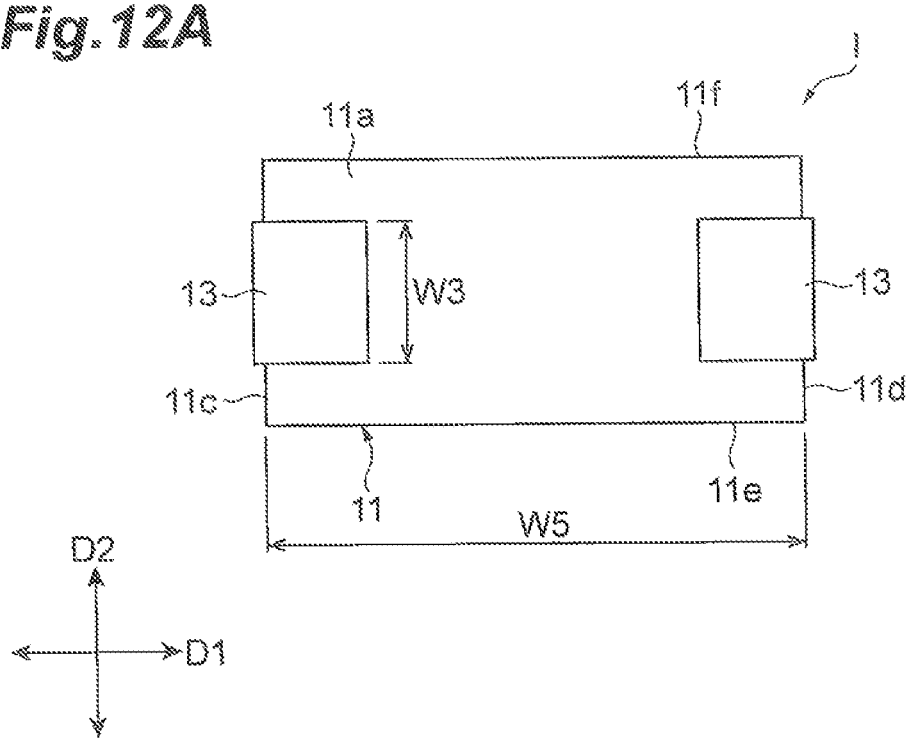
FIG. 12A is a top plan view showing the interposer in FIG. 9 and FIG. 12B a bottom plan view showing the interposer in FIG. 9.
Figure 12B:
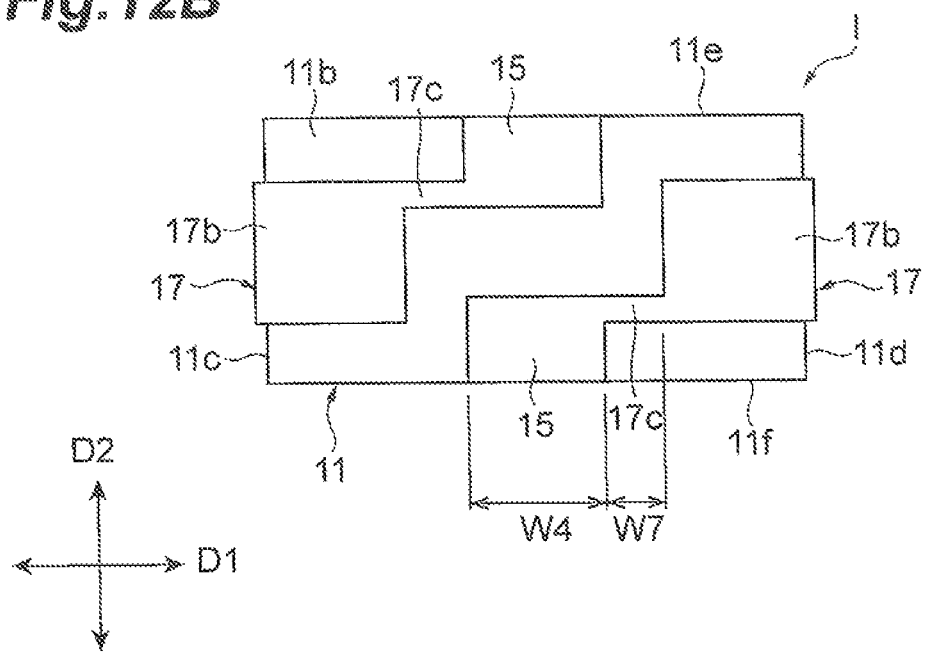

The configuration of the electronic component EP2 according to a second embodiment will be described with reference to FIGS. 9 to 11 and FIGS. 12A and 12B. FIGS. 9 and 10 are perspective views showing the electronic component of the second embodiment. FIG. 11 is an exploded perspective view showing the electronic component of the second embodiment. FIG. 12A is a top plan view showing the interposer in FIG. 9 and FIG. 12B a bottom plan view showing the interposer in FIG. 9.

As shown in FIGS. 9 to 11 and FIGS. 12A and 12B, the electronic component EP2 is different mainly in the following points from the electronic component EP1 of the first embodiment. First, the electronic component EP2 is different from the electronic component EP1 of the first embodiment in that the longitudinal direction of the element body 3 is the direction in which the pair of first side faces 3a are opposed, i.e., the first direction D1. In the electronic component EP1, the longitudinal direction of the element body 3 is the direction in which the pair of second side faces 3b are opposed, i.e., the second direction D2.

The electronic component EP2 is different from the electronic component EP1 of the first embodiment in that the first and second principal faces 11a, 11b of the interposer I are of a rectangular shape with the long sides along the first direction D1 and the short sides along the second direction D2. In the electronic component EP1, the first and second principal faces 11a, 11b of the interposer I are of the rectangular shape with the long sides along the second direction D2 and the short sides along the first direction D1.

The electronic component EP2 is different from the electronic component EP1 of the first embodiment in that the width W4 in the first direction D1 of the pair of second electrodes 15 is smaller than the width W5 in the first direction D1 of the substrate 11. In the electronic component EP1, the width W4 in the first direction D1 of the pair of second electrodes 15 is equal to the width W5 in the first direction D1 of the substrate 11. In the electronic component EP2, the pair of second electrodes 15 are disposed on a central region in the first direction D1 of the second principal face 11b.

The electronic component EP2 is different from the electronic component. EP1 of the first embodiment in that the pair of second electrodes 15 are disposed so as to be separated in the first direction D from the pair of first electrode 13. In the electronic component EP1, the pair of second electrodes 15 are disposed so as to be separated in the second direction D2 from the pair of first electrodes 13.

The electronic component EP2 is different from the electronic component EP1 of the first embodiment in that each third connection electrode 17c extends in the first direction D1 on the second principal face 11b. In the electronic component EP1, each third connection electrode 17c extends in the second direction D2 on the second principal face 11b.

The electronic component EP2 is different from the electronic component EP1 of the first embodiment in that the width W7 in the first direction D1 of each third connection electrode 17c corresponds to the width in the first direction D1 of a portion where neither of the first electrode 13 and the second electrode 15 is disposed. In the electronic component EP1, the width W6 in the second direction D2 of each third connection electrode 17c corresponds to the width in the second direction D2 of the portion where neither of the first electrode 13 and the second electrode 15 is disposed.

As described above, the electronic components EP1, EP2 according to the first and second embodiments are configured so that in the element body 3, when viewed from the first direction D1, the pair of second portions 32 are separated in the third direction D3 from the interposer I. For this reason, the electrostrictive vibration induced in the multilayer capacitor C is prevented from propagating directly from each second portion 32 of the element body 3 to the interposer I.

The external electrodes 5 of the multilayer capacitor C are connected to the first electrodes 13 of the interposer I. Each of the width W1 in the second direction D2 of the pair of external electrodes 5 and the width W3 in the second direction D2 of the pair of first electrodes 13 is smaller than the width W2 in the second direction D2 of the element body 3. The electrostrictive vibration generated in the first portion 31, which is a part of the element body 3, propagates mainly through the external electrodes 5 and the first electrodes 13 to the substrate 11 of the interposer I. Therefore, vibration propagating from the element body 3 to the substrate 11 of the interposer I is little as a result.

In the electronic component EP1, the pair of second electrodes 15 are disposed so as to be separated from the pair of first electrodes 13 in the second direction D2. In the electronic component EP2, the pair of second electrodes 15 are disposed so as to be separated from the pair of first electrodes 13 in the first direction D1. In the embodiments of the invention, as described above, the pair of second electrodes 15 are disposed so as to be separated from the pair of first electrodes 13 in the first direction D1 or in the second direction D2. For this reason, the vibration having propagated to the first electrodes 13 propagates through the portions located between the first electrodes 13 and the second electrodes 15 in the substrate 11, to reach the second electrodes 15. The vibration propagating in the substrate 11 attenuates while propagating through the portions located between the first electrodes 13 and the second electrodes 15 in the substrate 11.

For these reasons, the embodiments of the invention successfully reduce the vibration propagating from the multilayer capacitor C through the interposer I to the electronic device ED. As a result, the occurrence of acoustic noise is successfully suppressed.

The pair of second portions 32 of the element body 3 overlap the pair of second electrodes 15, when viewed from the third direction D3. For this reason, the size of the substrate 11 of the interposer I can be set approximately equal to or slightly larger than the multilayer capacitor C, when viewed from the direction in which the first principal face 11a and the second principal face 11b are opposed. This enables high-density mounting of the electronic components EP1, EP2.

Each connection electrode 17 is not located on the first principal face 11a opposed to the multilayer capacitor C. For this reason, even if each second portion 32 of the element body 3 vibrates due to the electrostrictive vibration, each second portion 32 will be kept out of contact with the connection electrode 17. Therefore, the vibration of each second portion 32 of the element body 3 is surely prevented from propagating to the interposer I.

Since the plurality of internal electrodes 7, 9 overlap the pair of second electrodes 15 when viewed from the third direction D3, the size of each internal electrode 7, 9 can be set relatively large. The capacitance of the multilayer capacitor C increases with increasing size of the internal electrodes 7, 9 if there is no variation in spacing between the internal electrodes 7, 9 adjacent in the stack direction. Therefore, it becomes feasible to achieve increase in capacitance of the multilayer capacitor C.

The below will describe the configuration of the electronic component according to the first modification example, with reference to FIGS. 13A to 13C.

Figure 13A:
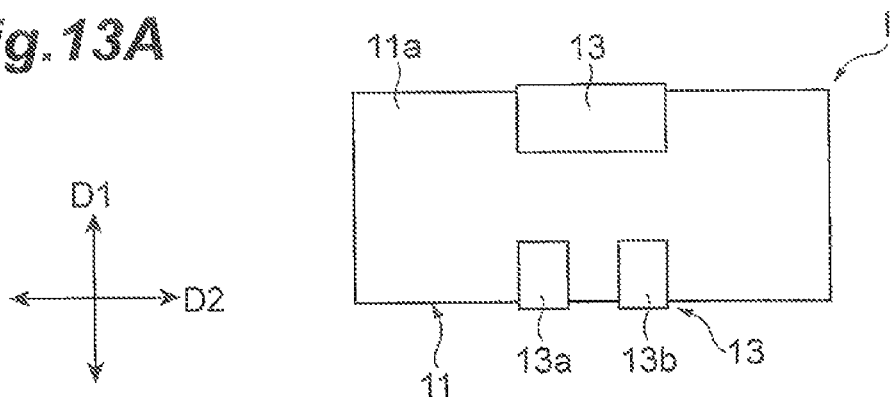
FIGS. 13A to 13C are drawings for explaining an electronic component according to a first modification example.
Figure 13B:
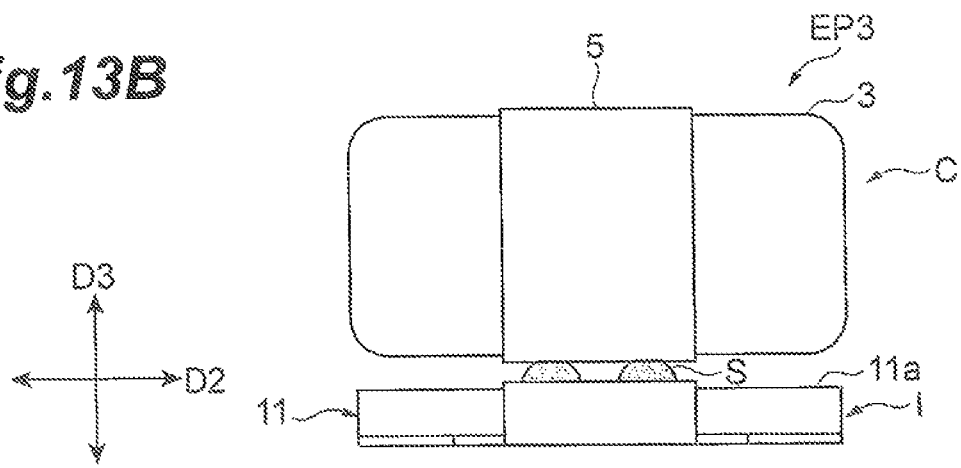
Figure 13C:
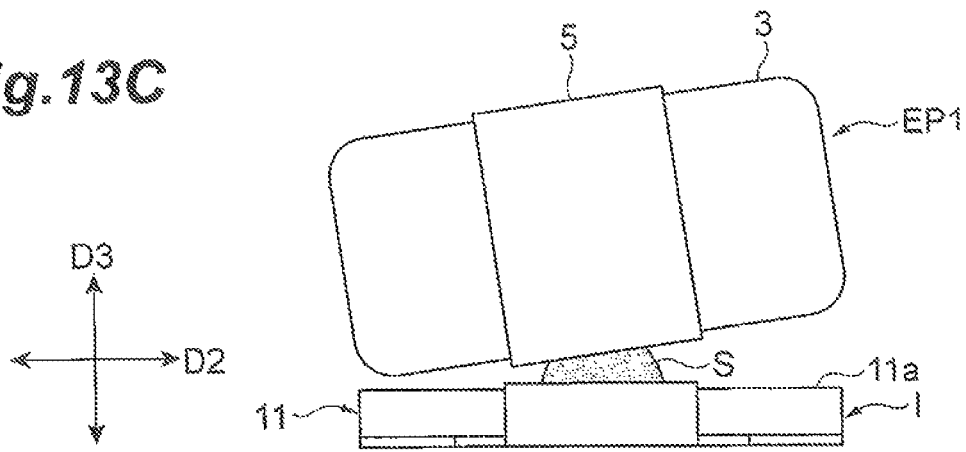

FIGS. 13A to 13C are drawings for explaining the electronic component according to the first modification example. Specifically, FIG. 13A is a top plan view showing the interposer of the electronic component according to the first modification example, FIG. 13B a side view from the first direction of the electronic component according to the first modification example, and FIG. 13C an example of the side view from the first direction of the electronic component according to the first embodiment.

As shown in FIG. 13A, the electronic component of the first modification example is different in the shape of the first electrodes 13 of the interposer I from the electronic component EP1 of the first embodiment. In the present modification example, one of the pair of first electrodes 13 has first and second electrode portions 13a, 13b. The first and second electrode portions 13a, 13b are separated from each other in the second direction D2. Each of the first and second portions 13a, 13b is of a rectangular shape when viewed from the third direction D3. The first and second electrode portions 13a, 13b each are of the same shape when viewed from the third direction D3.

In the case of the electronic component EP1 of the first embodiment, as shown in FIG. 13C, when the multilayer capacitor C is mounted on the interposer I, a piece of solder S is disposed on each of the pair of first electrodes 13. It results in supporting the multilayer capacitor C at two points by solder S and thus the multilayer capacitor C tends to be mounted in an inclined state.

In contrast to it, as shown in FIG. 13B, the electronic component EP3 of the first modification example is configured so that one of the external electrodes 5 of the multilayer capacitor C is connected to the first electrode portion 13a and the second electrode portion 13b in one first electrode 13. Since the first electrode portion 13a and the second electrode portion 13b are separated from each other in the second direction D2, the multilayer capacitor C comes to be supported at three points by solder S. When supported at three or more points, the multilayer capacitor C is maintained in a stable posture on the interposer I. This makes the multilayer capacitor C unlikely to be mounted in the inclined state. Therefore, the second portions 32 of the element body 3 are prevented from coming into contact with the interposer I. As a result, the occurrence of acoustic noise is surely suppressed.

The present modification example is configured so that only one of the first electrodes 13 has the first and second electrode portions 13a, 13b, but the other first electrode 13 may also be similarly configured so as to have the first and second electrode portions 13a, 13b. It is noted that FIG. 13B is depicted without illustration of the solder S provided on the other first electrode 13 side, for simplicity.

The configuration of the electronic component according to the second modification example will be described below with reference to FIGS. 14A to 14C.

Figure 14A:
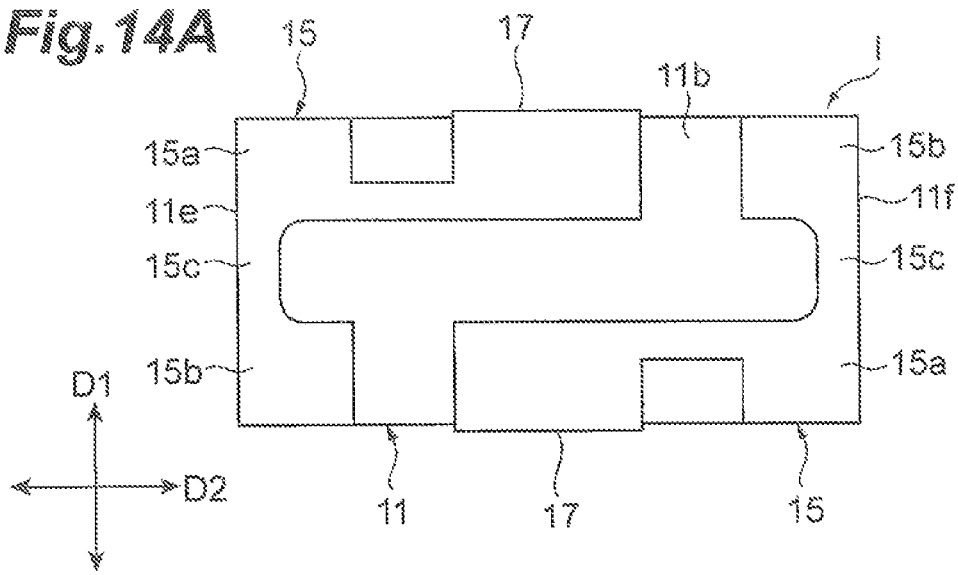
FIGS. 14A to 14C are drawings for explaining an electronic component according to a second modification example.
Figure 14B:
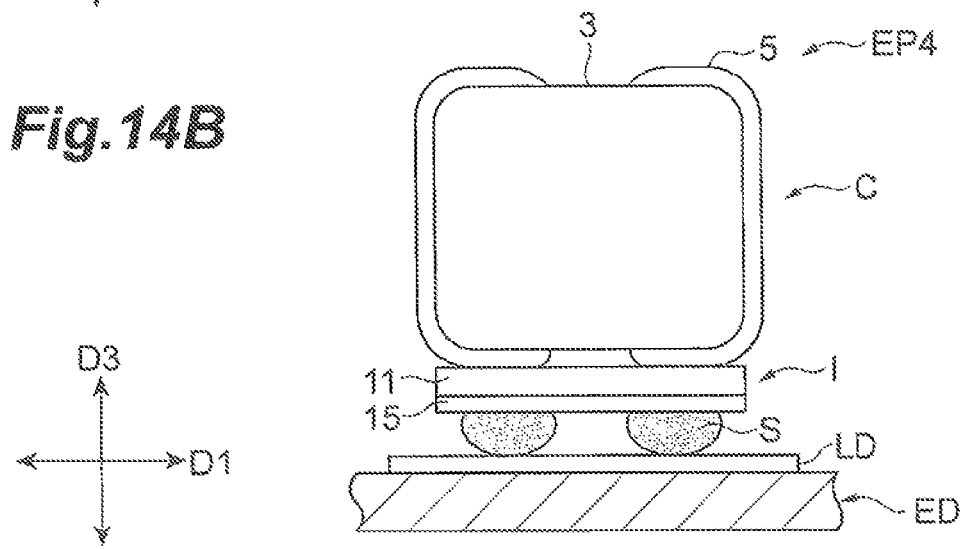
Figure 14C:
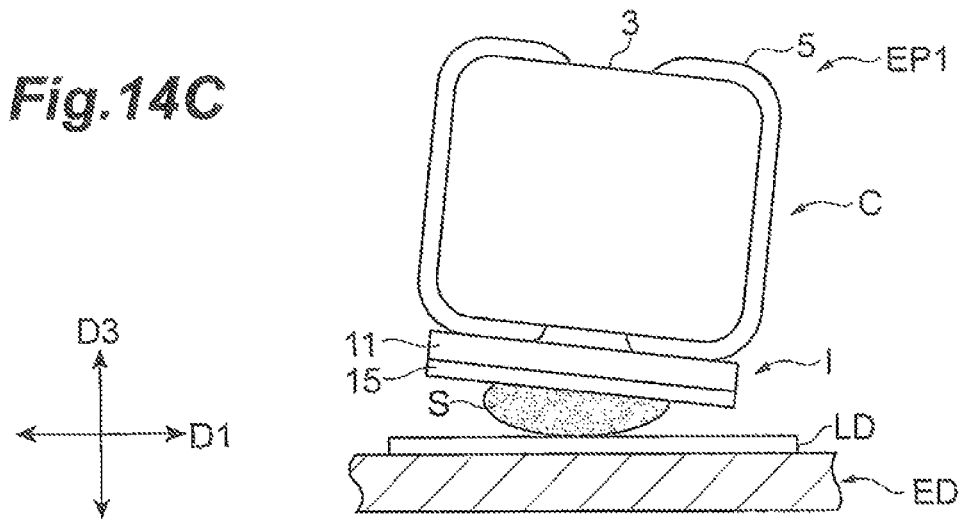

FIGS. 14A to 14C are drawings for explaining the electronic component according to the second modification example. Specifically, FIG. 14A is a top plan view showing the interposer of the electronic component according to the second modification example, FIG. 14B a side view from the second direction of a mounting example of the electronic component according to the second modification example, and FIG. 14C an example of the side view from the second direction of a mounting example of the electronic component according to the first embodiment.

As shown in FIG. 14A, the electronic component of the second modification example is different in the shape of the second electrodes 15 of the interposer I from the electronic component EP1 of the first embodiment. In the present modification example, each of the pair of second electrodes 15 has third and fourth electrode portions 15a, 15b separated from each other in the first direction D1, and a fifth electrode portion 15c connecting the third electrode portion 15a and the fourth electrode portion 15b. Each third electrode portion 15a is connected to the connection electrode 17. Furthermore, each fifth electrode portion 15c is disposed on the third or fourth side face 11e, 11f side of the second principal face 11b.

In the case of the electronic component EP1 of the first embodiment, as shown in FIG. 14C, when the electronic component EP1 is mounted on the electronic device ED, a piece of solder S is disposed on each of the pair of second electrodes 15. It results in supporting the electronic component EP1 at two points by solder S and thus the electronic component EP1 tends to be mounted in an inclined state.

In contrast to it, as shown in FIG. 14B, the electronic component EP4 of the second modification example is configured so that the electronic component EP4 is mounted on the electronic device ED through the third electrode portion 15a and the fourth electrode portion 15b in each second electrode 15. In each second electrode 15, a piece of solder S is disposed on each of the third and fourth electrode portions 15a, 15b. Since the third electrode portion 15a and the fourth electrode portion 15b are separated from each other in the first direction D1, the electronic component EP4 comes to be supported at four points by solder S. When supported at three or more points, the electronic component EP4 is maintained in a stable posture on the electronic device ED and on the land electrodes LD. This makes the electronic component EP4 unlikely to be mounted in the inclined state. As a result, the occurrence of acoustic noise is surely suppressed.

The present modification example is configured so that each second electrode 15 has the third and fourth electrode portions 15a, 15b, but only one of the second electrodes 15 may be configured so as to have the third and fourth electrode portions 15a, 15b. It is noted that FIG. 14B and FIG. 14C are depicted without illustration of the detailed configuration of the connection portion between the multilayer capacitor C and the interposer I, and others, for simplicity.

Figure 15A:
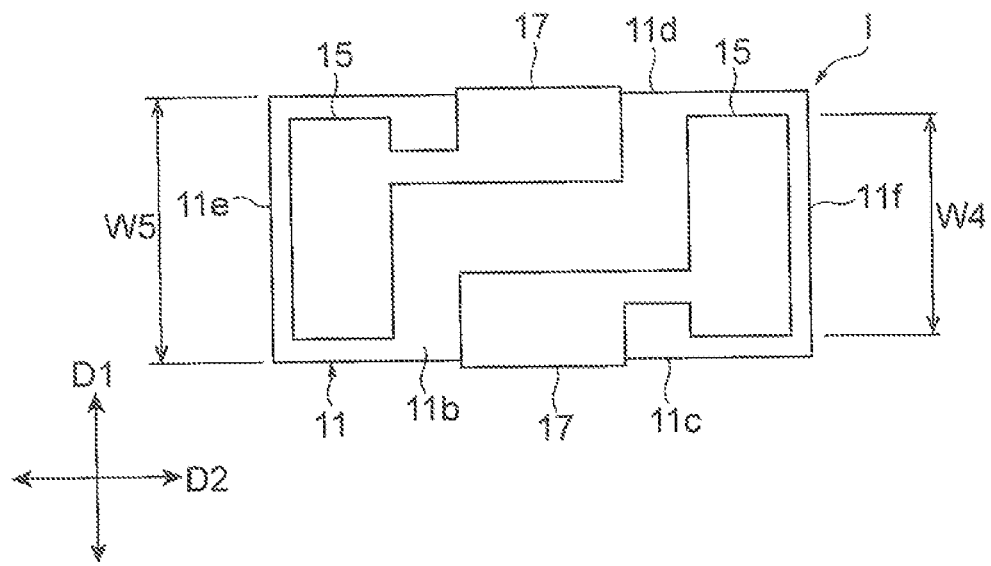
FIGS. 15A and 15B are drawings for explaining an electronic component according to a third modification example.

The following will describe the configuration of the electronic component according to the third modification example, with reference to FIGS. 15A an 15B.

Figure 15B:
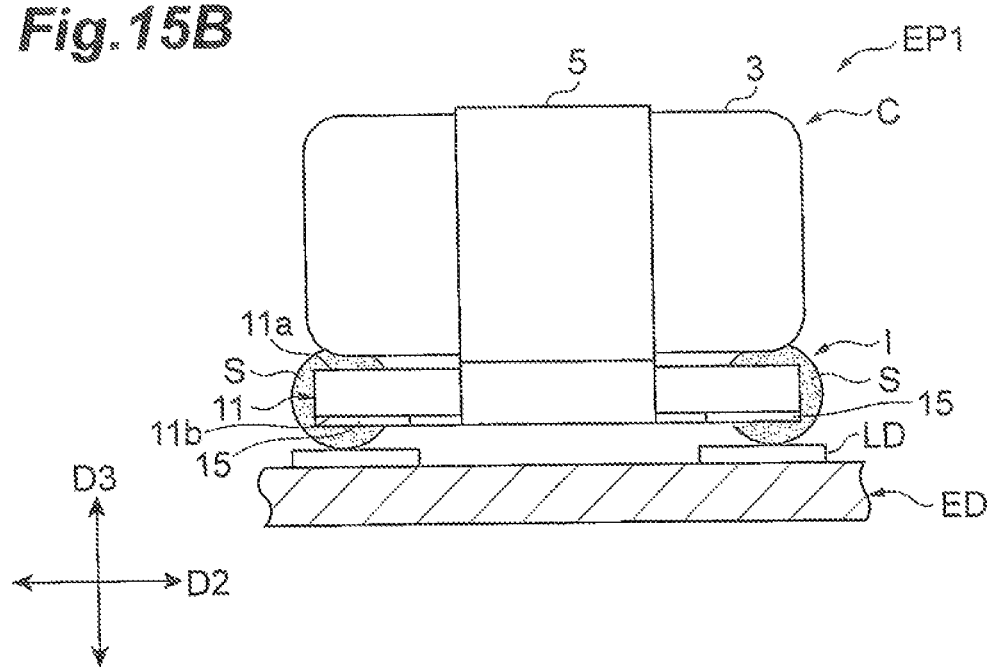

FIGS. 15A and 15B are drawings for explaining the electronic component according to the third modification example. Specifically, FIG. 15A is a top plan view showing the interposer of the electronic component according to the third modification example, and FIG. 15B an example of the side view from the first direction of a mounting example of the electronic component according to the first embodiment.

As shown in FIG. 15A, the electronic component of the third modification example is different in the shape of the second electrodes 15 of the interposer I from the electronic component EP1 of the first embodiment. Each second electrode 15 is disposed so as to be separated from the peripheral edge of the second principal face 11b when viewed from the third direction D3. Namely, each second electrode 15 is disposed so as to be separated from each of the first to fourth side faces 11c to 11f. The width W4 in the first direction D1 of the pair of second electrodes 15 is smaller than the width W5 in the first direction D1 of the substrate 11.

In the electronic component EP1 of the first embodiment, each second electrode 15 extends to the peripheral edge of the second principal face 11b when viewed from the third direction D3. For this reason, as shown in FIG. 15B, the solder S flows up to the first principal face 11a side when the electronic component EP1 is mounted on the electronic device ED. It may result in bringing the element body 3 into contact with the first principal face 11a through the solder S. In contrast to it, the electronic component of the present modification example is configured so that each second electrode 15 is disposed so as to be separated from the peripheral edge of the second principal face 11b when viewed from the third direction D3. For this reason, the solder S is prevented from flowing up to the first principal face 11a side in mounting the electronic component on the electronic device ED. This can prevent the element body 3 from being connected directly to the first principal face 11a through the solder S.

The above described the embodiments according to one aspect of the present invention but it should be noted that the present invention is by no means intended to be limited to the above-described embodiments and that the present invention can be modified in many ways without departing from the spirit and scope of the invention.

The shapes of the first electrodes 13, the second electrodes 15, and the connection electrodes 17 do not have to be limited only to the shapes in the above-described first and second embodiments and the first, second, and third modification examples. For example, the first electrodes 13 do not have to be limited to the rectangular shape. The width in the second direction D2 of each first connection electrode 17a and each second connection electrode 17b of each connection electrode 17 may be smaller or larger than the width W3 in the second direction D2 of each first electrode 13.

What is claimed is:

1. An electronic component comprising: a multilayer capacitor; and an interposer on which the multilayer capacitor is mounted,
wherein the multilayer capacitor comprises:
a multilayer body of a substantially rectangular parallelepiped shape in which a plurality of dielectric layers and a plurality of internal electrodes are stacked; and
a pair of external electrodes disposed on ends in a first direction in the multilayer body and each connected to a corresponding internal electrode of the plurality of internal electrodes, wherein the interposer comprises:
a substrate having a first principal face of a planar shape opposed to the multilayer capacitor, a second principal face of a planar shape opposed to the first principal face, first and second side faces of a planar shape opposed to each other in the first direction, and third and fourth side faces of a planar shape opposed to each other in a second direction perpendicular to a direction in which the first and second principal faces are opposed, and perpendicular to the first direction;
a pair of first electrodes disposed on the first and second side face sides of the first principal face and each connected to a corresponding external electrode of the pair of external electrodes; and
a pair of second electrodes disposed on the third and fourth side face sides of the second principal face so as to be separated from the pair of first electrodes in the first direction or in the second direction and each electrically connected to a corresponding first electrode of the pair of first electrodes,
wherein widths in the second direction of the pair of external electrodes and the pair of first electrodes are smaller than a width in the second direction of the multilayer body,
wherein the multilayer body, when viewed from the first direction, has a first portion covered by the external electrode, and a pair of second portions located on both sides of the first portion and exposed from the external electrode, and
wherein the pair of second portions of the multilayer body are separated from the interposer and overlap the pair of second electrodes when viewed from the direction in which the first and second principal face are opposed.

2. The electronic component according to claim 1, further comprising:
a pair of connection electrodes each of which connects the first electrode and the second electrode,
wherein the connection electrode connected to the first electrode disposed on the first side face side is disposed on the first side face and on the second principal face, and
wherein the connection electrode connected to the first electrode disposed on the second side face side is disposed on the second side face and on the second principal face.

3. The electronic component according to claim 1, wherein the plurality of internal electrodes overlap the pair of second electrodes when viewed from the direction in which the first and second principal faces are opposed.

4. The electronic component according to claim 1, wherein each of the pair of first electrodes has first and second electrode portions separated from each other in the second direction.

5. The electronic component according to claim 1, wherein each of the pair of second electrodes has third and fourth electrode portions separated from each other in the first direction.

6. The electronic component according to claim 1, wherein the pair of second electrodes are disposed so as to be separated from the peripheral edge of the second principal face when viewed from the direction in which the first and second principal faces are opposed.

* * * * *